(12) United States Patent
Hiyoshi

(10) Patent No.: US 10,541,188 B2
(45) Date of Patent: Jan. 21, 2020

(54) POWER MODULE AND MANUFACTURING METHOD THEREOF

(71) Applicants: Hyundai Motor Company, Seoul (KR); Kia Motors Corporation, Seoul (KR)

(72) Inventor: Michiaki Hiyoshi, Seoul (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 0 days.

(21) Appl. No.: 15/700,662

(22) Filed: Sep. 11, 2017

(65) Prior Publication Data

US 2018/0082920 A1    Mar. 22, 2018

(30) Foreign Application Priority Data

Sep. 20, 2016    (KR) .................. 10-2016-0120261

(51) Int. Cl.
| | | |
|---|---|---|
| *H01L 23/367* | (2006.01) | |
| *H01L 23/373* | (2006.01) | |
| *B23K 26/211* | (2014.01) | |
| *H01L 21/48* | (2006.01) | |
| *H01L 23/00* | (2006.01) | |

(52) U.S. Cl.
CPC ........ *H01L 23/3675* (2013.01); *B23K 26/211* (2015.10); *H01L 21/4882* (2013.01); *H01L 23/3735* (2013.01); *H01L 24/33* (2013.01); *H01L 24/83* (2013.01); *H01L 2224/32245* (2013.01); *H01L 2224/33181* (2013.01); *H01L 2924/1203* (2013.01); *H01L 2924/13055* (2013.01); *H01L 2924/13091* (2013.01); *H01L 2924/3511* (2013.01)

(58) Field of Classification Search
None
See application file for complete search history.

(56) References Cited

U.S. PATENT DOCUMENTS

| 5,381,859 | A  | * | 1/1995 | Minakami | ................ | F28F 3/02 |
|---|---|---|---|---|---|---|
| | | | | | | 165/80.3 |
| 2004/0038561 | A1 | * | 2/2004 | Topp | ...................... | H01L 23/32 |
| | | | | | | 439/67 |
| 2004/0241447 | A1 | * | 12/2004 | Fukushima | ........... | C04B 41/009 |
| | | | | | | 428/408 |
| 2010/0208427 | A1 | * | 8/2010 | Horiuchi | ............ | H05K 7/20927 |
| | | | | | | 361/699 |

FOREIGN PATENT DOCUMENTS

| JP | 2008-098586 A | | 4/2008 | | |
|---|---|---|---|---|---|
| JP | 2008-124430 A | | 5/2008 | | |
| JP | 2009188032 A | * | 8/2009 | .............. | H05K 1/05 |
| JP | 2009188032 A | | 8/2009 | | |

(Continued)

*Primary Examiner* — William A Harriston
(74) *Attorney, Agent, or Firm* — Mintz Levin Cohn Ferris Glovsky and Popeo, P.C.; Peter F. Corless

(57) ABSTRACT

A power module includes: a substrate; a power conversion chip disposed on one surface of the substrate; and a radiation member bonded to another surface of the substrate. The radiation member has a contact surface configured to come into contact with the other surface of the substrate, and includes a fused area within the contact surface so as to be fused to the other surface of the substrate.

4 Claims, 14 Drawing Sheets

(56) References Cited

FOREIGN PATENT DOCUMENTS

| | | |
|---|---|---|
| JP | 2011-066281 A | 3/2011 |
| JP | 2011101894 A | 5/2011 |
| KR | 10-2015-108363 | 7/2014 |
| KR | 10-2015-0119302 | 8/2014 |
| KR | 10-2014-0145129 A | 12/2014 |
| KR | 10-2015-0026862 | 3/2015 |

\* cited by examiner

Square  Circle  Diamond

POWER MODULE AND MANUFACTURING METHOD THEREOF

CROSS-REFERENCE TO RELATED APPLICATION

This application claims the benefit of priority to Korean Patent Application No. 10-2016-0120261, filed on Sep. 20, 2016, in the Korean Intellectual Property Office, the disclosure of which is incorporated herein by reference in its entirety.

BACKGROUND

1. Technical Field

The present disclosure relates generally to a power module and a manufacturing method thereof, and more particularly, to a power module having a bonding structure for a radiation member, which may more effectively dissipate heat generated in a power conversion chip, and a manufacturing method thereof.

2. Description of the Related Art

A power conversion device, such as an inverter, is one of the core components for environmentally friendly vehicles including hybrid vehicles and electric vehicles. A power module, which is a component of the power conversion device and accounts for most of the cost thereof, is another core component of environmentally friendly vehicles.

Modern development of the power module is centered on cost reduction and improvement of cooling performance. In the case of cooling performance, development is centered on double-sided cooling, single-sided cooling, and efficient cooler shape and bonding technologies has been mainly performed. When the cooling performance of the power module is improved, the rated current of power semiconductor devices that are currently used may be lowered, and the chip size may be reduced. Therefore, it is possible to reduce chip cost and stabilize operation of the power module.

Conventional power module cooling techniques include bonding a base plate, which serves as a heat spreader, to a substrate via soldering and a structure in which a cooling member is brought into contact with a substrate using a thermal interface material (TIM) (e.g., thermal grease). Problematically, the base plate is prone to bending when soldering. Therefore, the extent to which the thickness of the base plate can be reduced is limited, which limits improvement in heat radiation. In addition, using a TIM raises the thermal resistance of the entire power module because the thermal resistance of the TIM is relatively large, in the range of approximately 1 to 6 W/mK, which makes efficient heat radiation impossible.

The matters disclosed in this section are merely for enhancement of understanding of the general background of the disclosure and should not be taken as an acknowledgment that such matters form the related art already known to a person skilled in the art.

SUMMARY OF THE DISCLOSURE

Therefore, the present disclosure has been made in view of the above problems, and it is an object of the present disclosure to provide a power module having a bonding structure for a radiation member, which may more effectively dissipate heat generated in a power conversion chip, and a manufacturing method thereof.

In accordance with embodiments of the present disclosure, a power module includes: a substrate; a power conversion chip disposed on one surface of the substrate; and a radiation member bonded to another surface of the substrate, wherein the radiation member has a contact surface configured to come into contact with the other surface of the substrate, and includes a fused area within the contact surface so as to be fused to the other surface of the substrate.

The substrate may include a dielectric layer and first and second metal layers respectively formed on opposite surfaces of the dielectric layer, the power conversion chip may be disposed on one surface of the first metal layer, and the radiation member may be bonded to one surface of the second metal layer.

The fused area may have a mesh pattern.

The radiation member may include a base plate forming the contact surface, and radiation fins are formed on a surface of the base plate opposite the contact surface in a predetermined pattern.

The fused area may be formed in an area of the contact surface in which no radiation fin is formed.

Furthermore, in accordance with embodiments of the present disclosure, a method of manufacturing a power module includes: attaching a power conversion chip to one surface of a substrate; bonding a radiation member to another surface of the substrate; and fusing the radiation member to the other surface of the substrate by radiating a laser beam to an area of a surface of the radiation member opposite a contact surface of the radiation member that comes into contact with the other surface of the substrate.

The substrate may include a dielectric layer and first and second metal layers respectively formed on opposite surfaces of the dielectric layer, the attaching of the power conversion chip to the surface of the substrate may include attaching the power conversion chip to one surface of the first metal layer, and the fusing of the radiation member to the other surface of the substrate may include fusing the radiation member to one surface of the second metal layer.

The area to which the laser beam is radiated may have a mesh pattern.

The radiation member may include a base plate having a contact surface with the substrate, and radiation fins may be formed on a surface of the base plate opposite the contact surface in a predetermined pattern.

The fusing of the radiation member to the other surface of the substrate may include fusing the radiation member to the other surface of the substrate by radiating the laser beam between the radiation fins.

The method may further include controlling a strength of the laser beam, a surface area over which the laser beam is radiated, or a time during which the laser beam is radiated according to a position of the radiation member and thermal distribution of the radiation member.

BRIEF DESCRIPTION OF THE DRAWINGS

The above and other objects, features and other advantages of the present disclosure will be more clearly understood from the following detailed description taken in conjunction with the accompanying drawings, in which.

Figure 1:
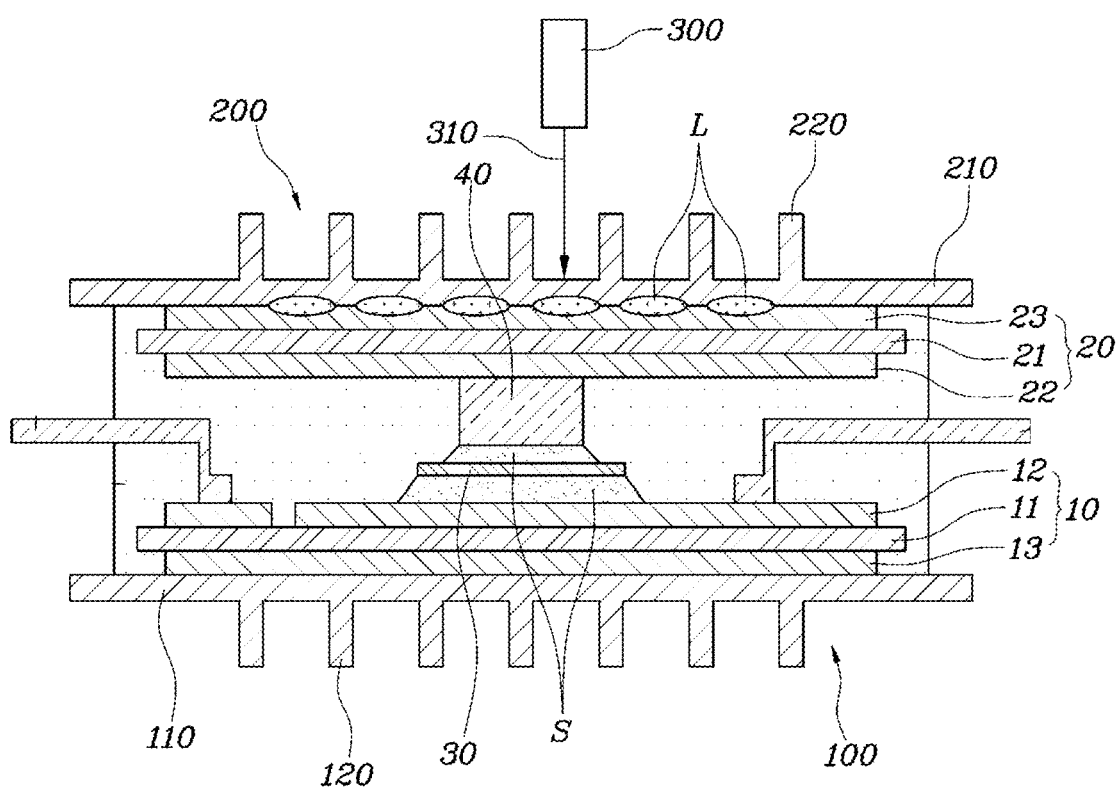
FIG. 1 is a cross-sectional view illustrating a power module according to embodiments of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Embodiments of the present disclosure will now be described in detail with reference to the accompanying drawings. As those skilled in the art would realize, the described embodiments may be modified in various different ways, all without departing from the spirit or scope of the present disclosure. Further, throughout the specification, like reference numerals refer to like elements.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Hereinafter, a power module and a manufacturing method thereof according to various embodiments of the present disclosure will be described with reference to the accompanying drawings.

FIG. 1 is a cross-sectional view illustrating a power module according to embodiments of the present disclosure.

As illustrated in FIG. 1, the power module according to embodiments of the present disclosure may include substrates 10 and 20, a power conversion chip 30, and radiation members 100 and 200.

In particular, the example illustrated in FIG. 1 has a double-sided cooling structure in which the two substrates 10 and 20 are provided on opposite upper and lower sides, respectively, of the power conversion chip 30, the radiation member 100 is disposed on the lower surface of the lower substrate 10, and the radiation member 200 is disposed on the upper surface of the upper substrate 20. In addition, the lower surface of the power conversion chip 30 may be bonded to the lower substrate 10 via a solder S, and the upper surface of the power conversion chip 30 may be bonded to the lower surface of the upper substrate 20 via a spacer 40. Here, the upper surface of the power conversion chip 30 may be bonded to the spacer 40 via a solder S.

The substrates 10 and 20 serve as a base material for forming a double-sided cooling structure on the upper and lower sides of the power conversion chip 30, which is interposed therebetween. In embodiments of the present disclosure, the substrates 10 and 20 may be, for example, active metal brazing (AMB) substrates, direct bonded copper (DBC) substrates, or direct bonded aluminum (DBA) substrates.

These substrates 10 and 20, i.e., the AMB substrates, the DBC substrates, or the DBA substrates, are manufactured by bonding metal layers 12, 13, 22 and 23 to opposite surfaces of dielectric layers 11 and 21 having a dielectric component (e.g., a ceramic or a fiber-reinforced plastic (FRP)). The metal layers 12 and 22 may be employed as electrodes that implement the electrical connection with the power conversion chip 30, and the metal layers 13 and 23 may be employed as elements that implement the contact with the radiation members 100 and 200.

The power conversion chip 30 may be an electrical device that is disposed between the substrates 10 and 20 to produce electrical flow for power conversion, and may be manufactured via, for example, a semiconductor process. For example, the power conversion chip 30 may include a metal-oxide-semiconductor field-effect transistor (MOSFET) or an insulated-gate bipolar transistor (IGBT), which is a switching device, or a diode that is connected to the switching device. Such a power conversion chip 30 generates a great amount of heat because the chip undergoes switching at a very fast cycle, and thus the flow of current is frequently interrupted.

The power conversion chip 30 may be provided with terminals for electrical connection at the upper and lower sides thereof. In the example of FIG. 1, the terminal (not shown) located at the lower side of the power conversion chip 30 may be connected to the upper metal layer 12 of the lower substrate 10, and the terminal located at the upper side of the power conversion chip 30 may be connected to, for example, a separate lead via, for example, a wire, although this is not illustrated.

Although the example in FIG. 1 illustrates a double-sided bonding structure in which the substrates 10 and 20 are provided respectively at opposite sides of the power conversion chip 30 and the radiation members 100 and 200 are disposed on the outer surfaces of the substrates 10 and 20, another example of the present disclosure may include a single-sided cooling structure in which a substrate is provided on only one side of the power conversion chip 30.

The radiation members 100 and 200 serve to dissipate heat generated in the power conversion chip 30 to the outside of the power module. These radiation members 100 and 200 may be manufactured using a metal having excellent thermal conductivity (e.g., Ag, Cu, Au, Al, Mg, W, or an alloy thereof). The radiation members 100 and 200 may respectively include base plates 110 and 210 forming contact surfaces for the metal layers 13 and 23 of the substrates 10 and 20 and a plurality of radiation fins 120 and 220 protruding from the base plates 110 and 210.

In various embodiments of the present disclosure, the radiation members 100 and 200 are bonded to the metal layers 13 and 23 of the substrates 10 and 20 using a laser welding method. Thereby, the radiation members 100 and 200 and the metal layers 13 and 23 of the substrates are bonded to each other via metal fusing, and a fused area L is formed on the area to which a laser beam 310 is radiated.

Although FIG. 1 describes that a laser emission device 300 radiates the laser beam 310 from the upper side of the upper radiation member 200, a laser beam may be radiated from the lower side of the lower radiation member 100, whereby the lower radiation member 100 and the metal layer 13 of the lower substrate 10 may also be bonded to each other.

Figure 2:
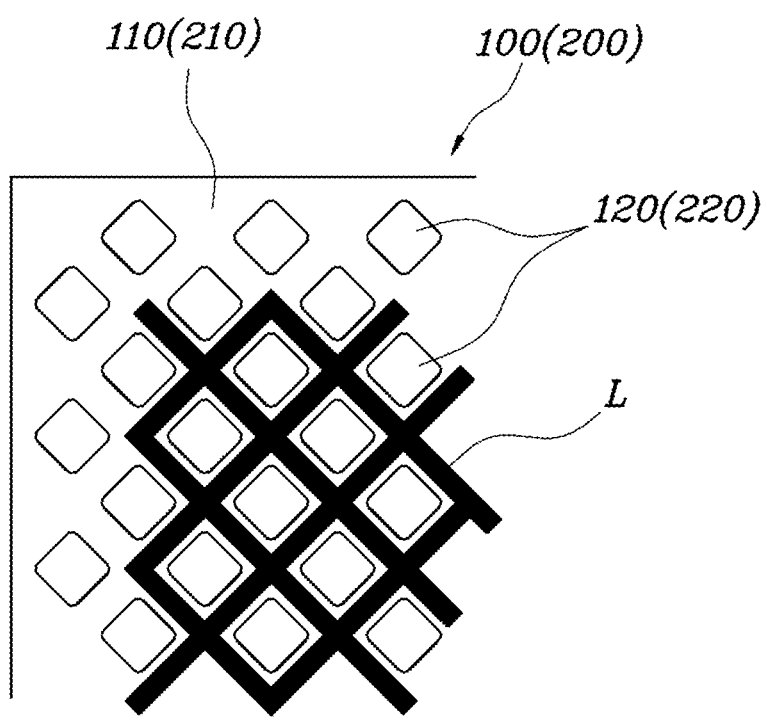
FIG. 2 is a partial plan view for explaining a fused area of the power module according to embodiments of the present disclosure.

FIG. 2 is a partial plan view for explaining a fused area of the power module according to embodiments of the present disclosure. That is, FIG. 2 is a plan view illustrating the lower surface of the lower radiation member 100 or the upper surface of the upper radiation member 200.

As illustrated in FIG. 2, in order to form bonding between the radiation members 100 and 200 and the metal layers 13 and 23 of the substrates, a laser-beam radiation area L to which a laser beam is radiated may be formed to have a predetermined mesh pattern. That is, for the bonding between the radiation members 100 and 200 and the metal layers 13 and 23 of the substrates, a laser beam may be radiated to the base plates 110 and 210 of the radiation members 100 and 200 according to a predetermined mesh pattern.

In particular, in embodiments of the present disclosure, the radiation fins 120 and 220 may be formed to have a predetermined arrangement pattern on the base plates 110 and 210. In this case, a laser beam may be radiated to the area on the base plates 110 and 210 in which no radiation fins 120 and 220 are formed, whereby the laser-beam radiation area L may attain a predetermined mesh pattern.

Figure 3:
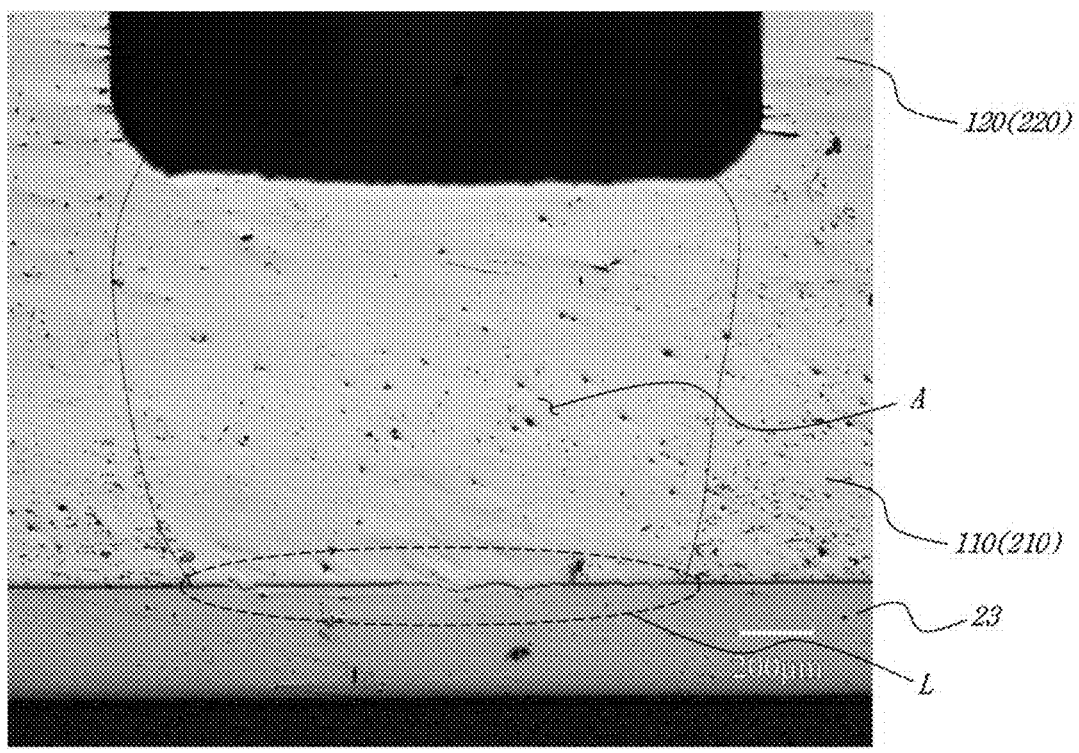
FIG. 3 is an enlarged electron micrograph of the cross section of the fused area of the power module according to embodiments of the present disclosure.

FIG. 3 is an enlarged electron micrograph of the cross section of a fused area of the power module according to embodiments of the present disclosure.

As illustrated in FIG. 3, it can be determined that, when a laser beam is radiated to the area on the base plates 110 and 210 between the radiation fins 120 and 220, an area A in which the base plates 110 and 210 are melted is formed above the area to which a laser beam is radiated, and the base plates 110 and 220 form an area L, which is fused to the metal layers of the substrates, above the melted area A.

In FIG. 3, the constituent material of the radiation members 100 and 200 is aluminum (Al), and the material of the metal layers of the substrates is copper (Cu).

Figure 4:
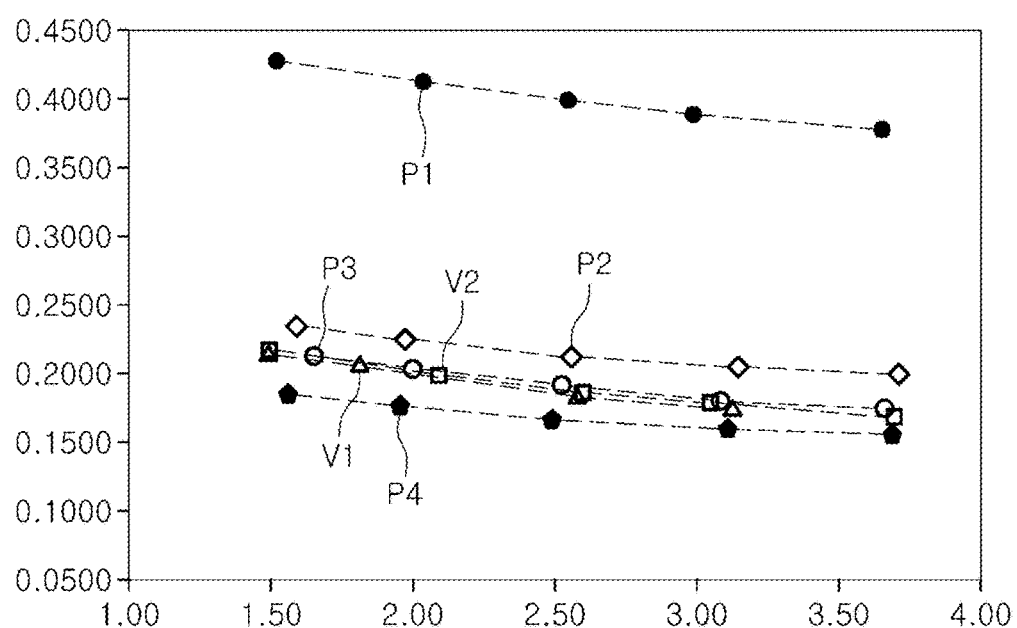
FIG. 4 is a graph for comparison between the performance of a power module using a conventional cooling method and the performance of the power module according to embodiments of the present disclosure.

FIG. 4 is a graph for comparison between the performance of a power module using a conventional cooling method and the performance of the power module according to embodiments of the present disclosure.

In FIG. 4, reference numeral "P1" indicates thermal resistance measured when a conventional method of adding thermal grease between the substrates 10 and 20 and the radiation members 100 and 200 in a close-contact manner is applied, reference numerals "P2" to "P4" indicate thermal resistances measured when a conventional method of soldering the entire contact surfaces between the substrates 10 and 20 and the radiation members 100 and 200 is applied, and reference numerals "V1" and "V2" indicate thermal resistances measured when a laser beam is radiated to an area of the contact surfaces between the substrates 10 and 20 and the radiation members 100 and 200 so as to form a fused area according to the embodiment of the present disclosure. In addition, in FIG. 4, the vertical axis represents the thermal resistance, the unit of which is "K/W", and the horizontal axis represents the flow rate of cooling water, the unit of which is "L/min".

As illustrated in FIG. 4, the structure of forming the bonding between the substrates 10 and 20 and the radiation members 100 and 200 via laser welding according to embodiments of the present disclosure exhibits much lower thermal resistance than the conventional technique of realizing contact using thermal grease (as low as one-half thereof), and in particular, exhibits a level of thermal resistance almost equal to that of the technique in which the entire contact surface is bonded via soldering.

Accordingly, the power module according to various embodiments of the present disclosure may achieve sufficient thermal resistance without soldering the entire bonding surface between the substrate and the radiation member, and therefore may eliminate difficulty in the management of flatness due to the bending of the base plate of the radiation member that is caused upon soldering. Thereby, the thickness of the base plate may be reduced, which enables high heat radiation.

In addition, the power module according to various embodiments of the present disclosure may implement direct bonding within a short time because the bonding between the substrate and the radiation member is simply implemented via laser-beam radiation, and may achieve high-quality heat radiation even without using a separate bonding material such as, for example, a solder or a grease, or a material required to form a thermal interface.

Meanwhile, embodiments of the present disclosure also provide a method of manufacturing the power module described above.

Referring again to FIG. 1, the method of manufacturing the power module according to embodiments of the present disclosure may include attaching the power conversion chip 30 to one surface of the respective substrates 10 and 20, disposing the radiation members 100 and 200 so as to come into contact with the other surface of the respective substrates 10 and 20, and fusing the radiation members 100 and 200 to the other surface of the respective substrates 10 and 20 by radiating the laser beam 310 to an area of the surface of the radiation members 100 and 200 that is opposite the contact surface with the substrates 10 and 20.

As described above, in the fusing step, the laser beam may be radiated to have a mesh pattern on the base plates 110 and 210 of the radiation members 100 and 200. In particular, when the radiation fins 120 and 220 are arranged in a predetermined pattern on the surface of the respective base plates 110 and 210 opposite the contact surface thereof, in the fusing step, the laser beam may be radiated to the area on the base plates 110 and 210 that corresponds to gaps between the multiple radiation fins 120 and 220 so as to fuse the radiation members 100 and 200 to the other surface of the respective substrates 10 and 20.

In particular, in embodiments of the present disclosure, in the process of radiating the laser beam for laser welding, the radiation density of the laser beam may be adjusted so as to determine different welding densities in different areas on the base plates 110 and 210. That is, when a laser beam is radiated on the laser-beam radiation area L having the pattern illustrated in FIG. 2, the strength of the laser beam, the surface area over which the laser beam is radiated, or the time during which the laser beam is radiated may be increased in order to realize a high welding density in an area having high thermal distribution (e.g., the area immediately above or immediately below the power conversion chip 30). In addition, the strength of the laser beam, the surface area over which the laser beam is radiated, or the time during which the laser beam is radiated may be reduced in order to realize a low welding density in an area having low thermal distribution (e.g., the outer peripheral area of the base plates 110 and 210).

With this variation in welding density, an embodiment of the present disclosure may alleviate thermal stress caused by the difference in the coefficients of thermal expansion between the base plates 110 and 210 and the metal layers 13 and 23 of the substrates 10 and 20, which are fused to each other, and may ensure the implementation of an efficient process.

As is apparent from the above description, according to a power module and a manufacturing method thereof, sufficient thermal resistance may be achieved without soldering the entire bonding surface between a substrate and a radiation member. Thereby, it is possible to prevent the bending of a base plate of the radiation member that is caused upon soldering, which enables a reduction in the thickness of the base plate.

In addition, according to the power module and the manufacturing method thereof, direct bonding between the substrate and the radiation member may be simply implemented via laser-beam radiation within a short time, and high-quality heat radiation may be achieved even without using a separate bonding material such as, for example, a solder or a grease, or a material required to form a thermal interface.

Hereinafter, more detailed experimental examples according to various embodiments of the present disclosure will be described.

Figure 5:
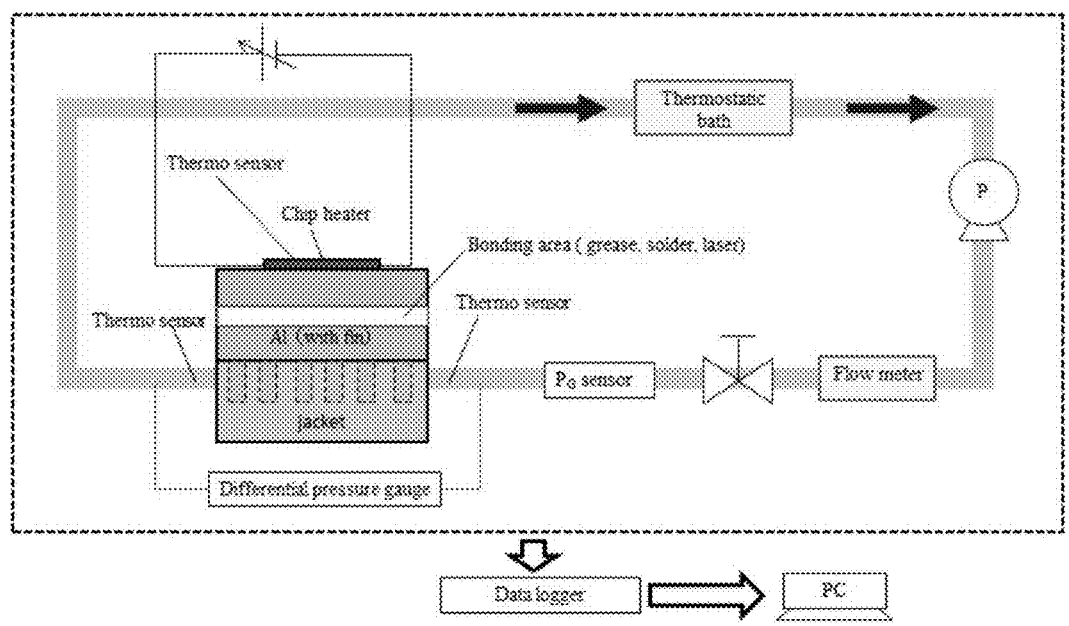
FIG. 5 is a diagram showing an experimental apparatus of experimental examples according to embodiments of the present disclosure.

To evaluate cooling performance, the total thermal resistance from chip temperature to cooling water and the pressure loss from inlet to outlet were investigated by using experimental apparatus shown in FIG. 5.

The heat resistance can be obtained as:

$$R = \frac{T_j - T_f}{Q} \quad (1)$$

Q: quantity of heat[kW], R: thermal resistance[K/kW], Tj: chip temperature[K], Tf: cooling water temperature [K]

Chip temperature is obtained indirectly by using the correlation between temperature and electric resistance.

Pressure loss can be obtained as:

$$\Delta P = P\text{in} - P\text{out} \quad (2)$$

Pin: inlet pressure[kPa], Pout: outlet pressure [kPa]
Experimental conditions are shown in following table 1.

TABLE 1

| Flow rate [L/min] | 1.5, 2.0, 2.5, 3.0, 3.7 |
| Temperature of cooling water [° C.] | 25 |
| Quantity of heat [W] | 100 |
| Heat flux [W/cm$^2$] | 100 |
| Geometry of pin-fin | Square, Circle, Diamond |
| Bonding procedure | Solder, Grease, Laser* |

*Laser is divided into 3 types (high laser power, middle laser power, low laser power)

In this experiment, the unit test has been done by using chip heater. The value of flow rate and heat flux is determined, considering the value of actual power device and cooling system. With respect to bonding procedure, solder bonding and laser bonding are investigated as direct cooling with comparing to traditional grease bonding as indirect bonding.

Figure 6:
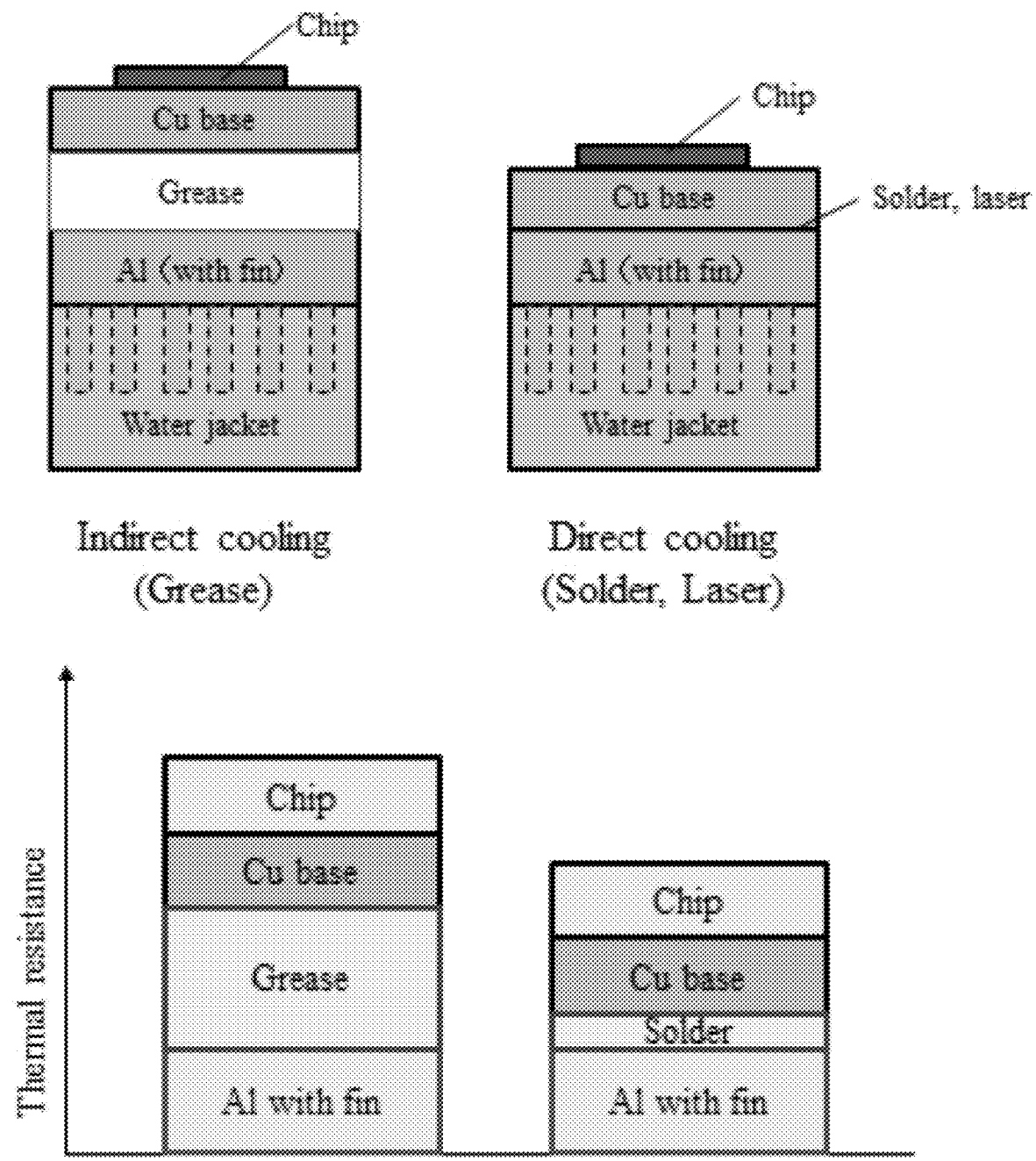
FIG. 6 is a diagram showing a difference between indirect cooling and direct cooling of experimental examples according to embodiments of the present disclosure.

The difference between indirect cooling and direct cooling is shown in FIG. 6

It can be seen from FIG. 6 that direct cooling can reduce the total thermal resistance by removing grease whose thermal resistance is high. It is stated that direct cooling can reduce about 30% of thermal resistance. Though several studies regarding to direct bonding (mainly solder bonding) is presented, there are little researches referring to laser bonding. In this experiment, laser bonding which is superior in terms of ease to manufacture is investigated experimentally, in addition to grease and solder bonding.

Figure 7:
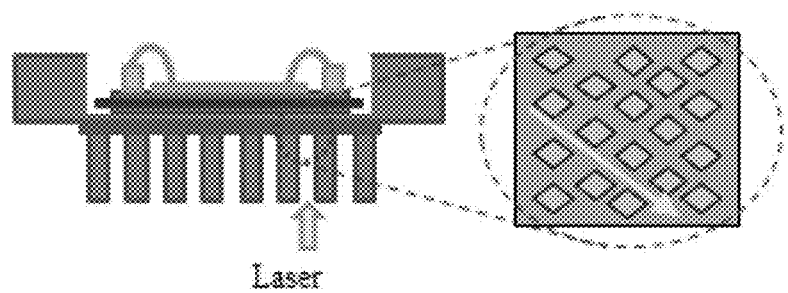
FIG. 7 is a diagram showing a way of laser bonding applied in experimental examples according to embodiments of the present disclosure.

The way of laser bonding is shown in FIG. 7. Laser is irradiated from the pin-fin side. The scale of circle pin-fin and square pin-fin are determined such that laser irradiation area is same.

Figure 8:
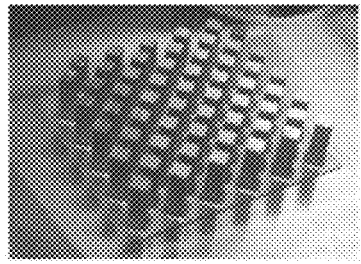
FIG. 8 is a diagram showing various pin-fin structures applied in experimental examples according to embodiments of the present disclosure.
Figure 8:
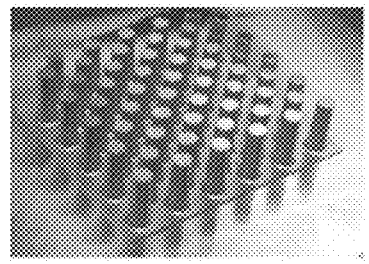
Figure 8:
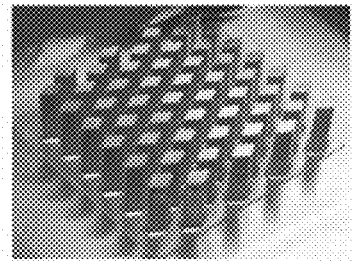

The actual images of three types of pin-fin, and the detailed specifications of each pin-fin are shown in FIG. 8 and Table 2, respectively.

TABLE 2

| Geometry | Square | Circle | Diamond |
|---|---|---|---|
| The number of pin-fin | 55 | 55 | 52 |
| Length of a side/diameter [mm] | 1.6 | Φ1.6 | 1.5 |
| Height [mm] | 5 | 5 | 5 |
| Arrangement | staggered | staggered | staggered |
| Surface area [mm$^2$] | 1795 | 1409 | 1468 |

Figure 9:
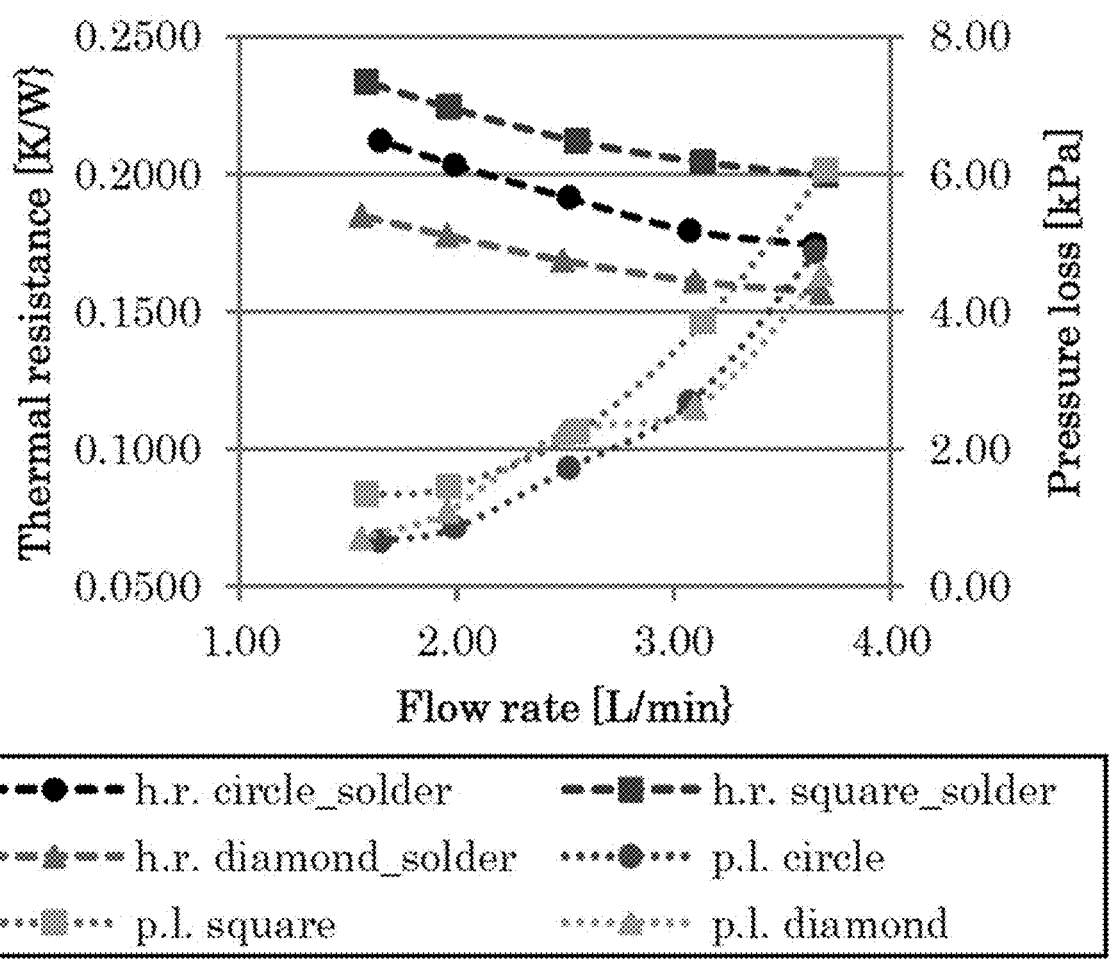
FIG. 9 is a graph showing experimental results with respect to pin-fin structure applied in experimental examples according to embodiments of the present disclosure.

The experimental results with respect to pin-fin structure are shown in FIG. 9.

The line which is growing with increase of flow rate indicates the pressure loss, and the line which is decreasing as increase of flow rate indicates the thermal resistance. It has been found that the thermal resistance of diamond pin-fin is the smallest in spite of surface area of diamond pin-fin is smaller than that of square pin-fin. The thermal resistance of convection is expressed as:

$$R_{conv} = \frac{1}{h \cdot A} \quad (3)$$

h: heat transfer coefficient [W/(mm·K), A: radiation surface area [mm$^2$]

Additionally, h can be expressed as:

$$h \approx \frac{q}{T_w - T_f} = \frac{-\frac{\partial T}{\partial x}\big|_{x=0}}{T_w - T_f} \approx \frac{k\frac{(T_w - T_f)}{\delta_T}}{T_w - T_f} \approx \frac{k}{\delta_T} \quad (4)$$

Tw: surface temperature [K], $T_f$: temperature of cooling water [K], k: thermal conductivity [W(mm·K)], δT: thermal boundary layer thickness [mm]

Figure 10:
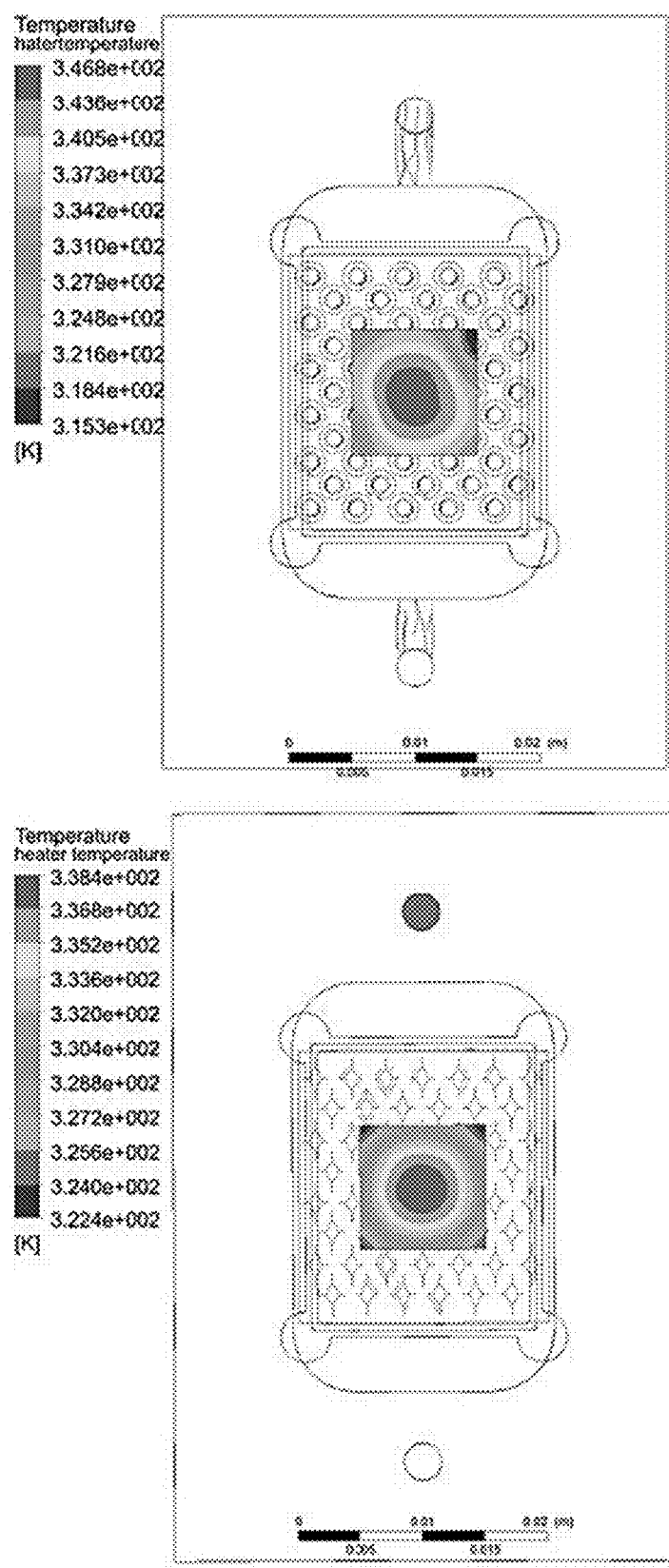
FIG. 10 is a diagram showing analytical results of experimental examples according to embodiments of the present disclosure.

Thus, it can be expected that increase of flow velocity parallel with a wall surface makes δT thin, leading increase of heat transfer coefficient. However, these results are different from analytical results. The analytical results and the maximum temperature of IC chip are shown in FIG. 10, Table 3, respectively.

TABLE 3

|  | Circle | Square | Diamond |
|---|---|---|---|
| Simulation | 54.27 | 61.70 | 58.48 |
| Experiment | 42.62 | 45.09 | 41.15 |

Figure 11:
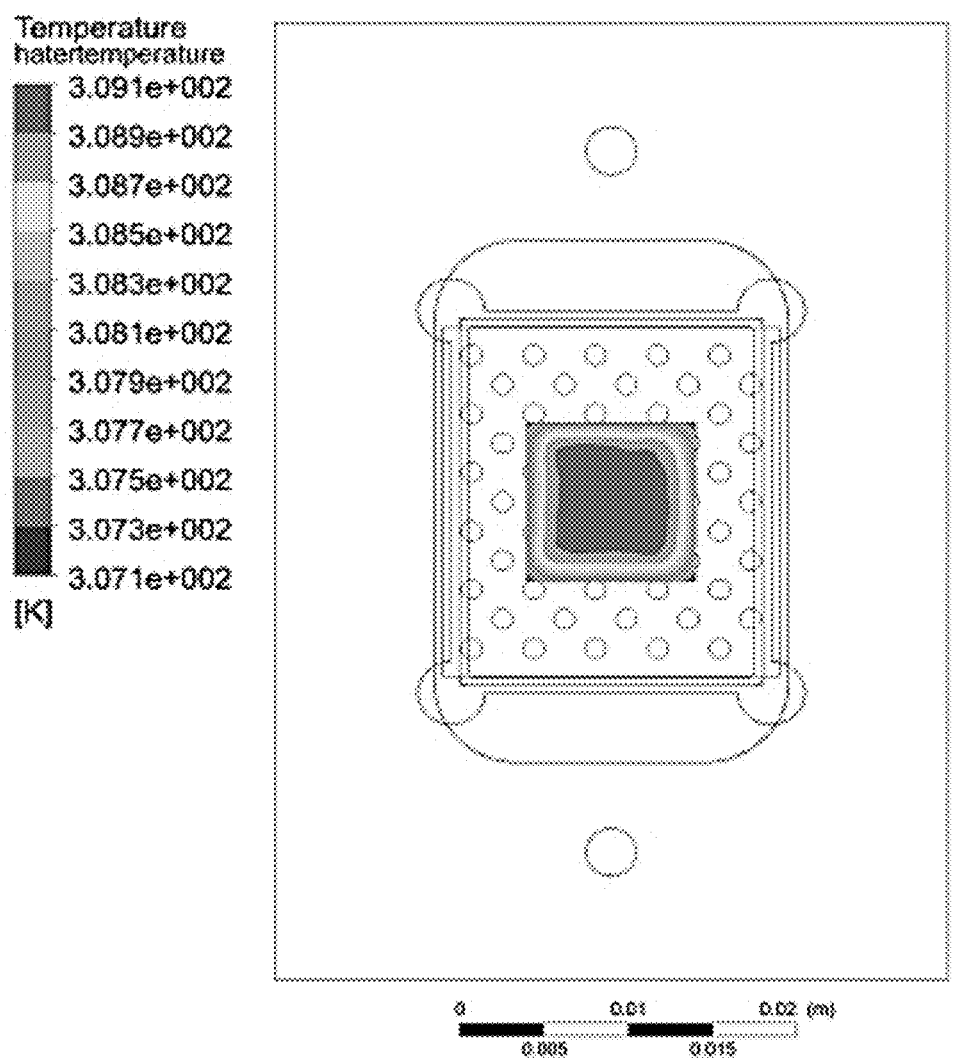
FIG. 11 is a diagram showing an analytical result of experimental examples according to embodiments of the present disclosure when applying LES.

It can be seen from these results that experimental results and analytical results are not similar, also relatively. To improve precision of simulation, simulation has been done again with changing the size of mesh around pin-fin and changing turbulence model from RANS to LES. The analytical result when applying LES, and the table comparing with RANS are shown in FIG. 11, Table 4, respectively.

TABLE 4

| Turbulence model | Experimental value | Average temperature of IC chip | Difference to experiment |
|---|---|---|---|
| RANS | 42.62 [° C.] | 54.27 [° C.] | +11.65 [° C.] |
| LES |  | 35.85 [° C.] | −6.77 [° C.] |

From these results, it is confirmed that high-precision simulation can be performed by changing turbulence model from RANS to LES. Since the main difference of these two types of turbulence model is that LES can consider relatively large vortex which could generate around pin-fin, it is found that more research regarding to vortex when changing pin-fin geometry is needed.

With respect to the pressure loss, it is confirmed to increase in the order of 'Circle≅Diamond<Square', which is the same order of the surface area.

Figure 12:
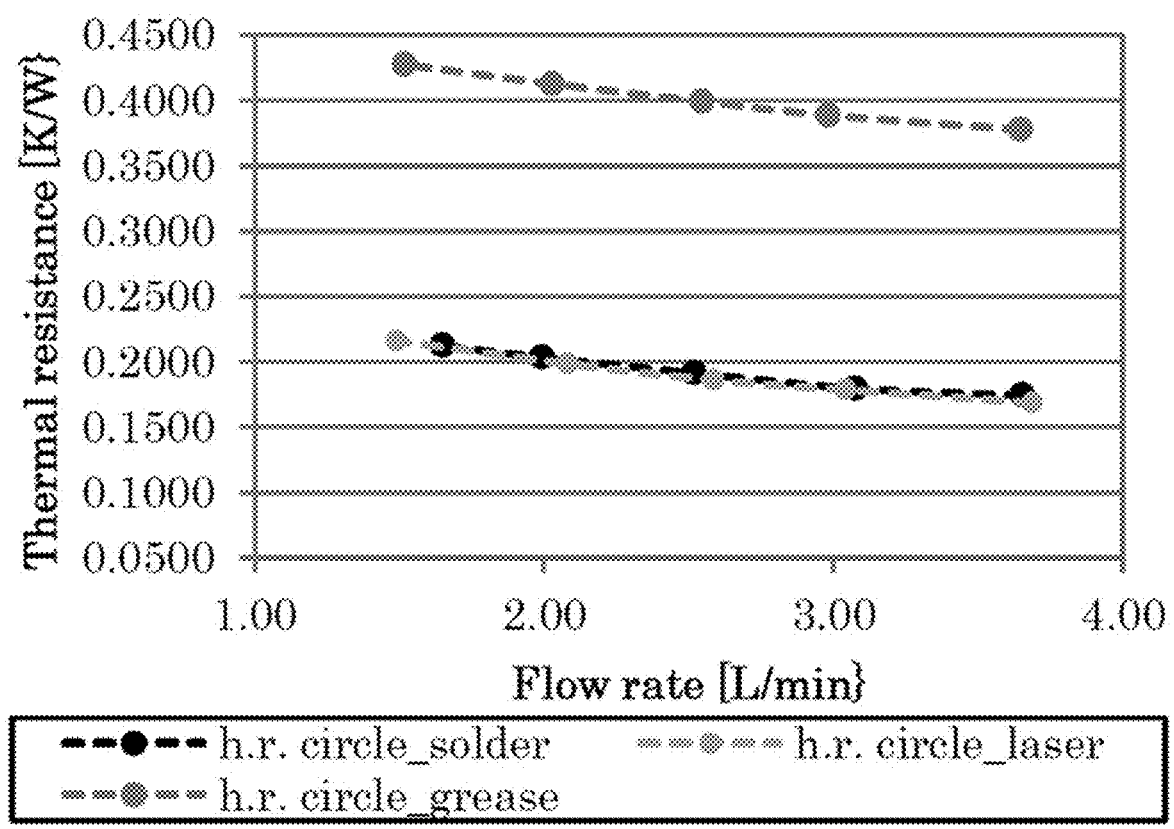
FIG. 12 is a graph showing experimental results with respect to bonding procedure applied in experimental examples according to embodiments of the present disclosure.

The results with respect to bonding procedure are shown in FIG. 12.

Figure 13:
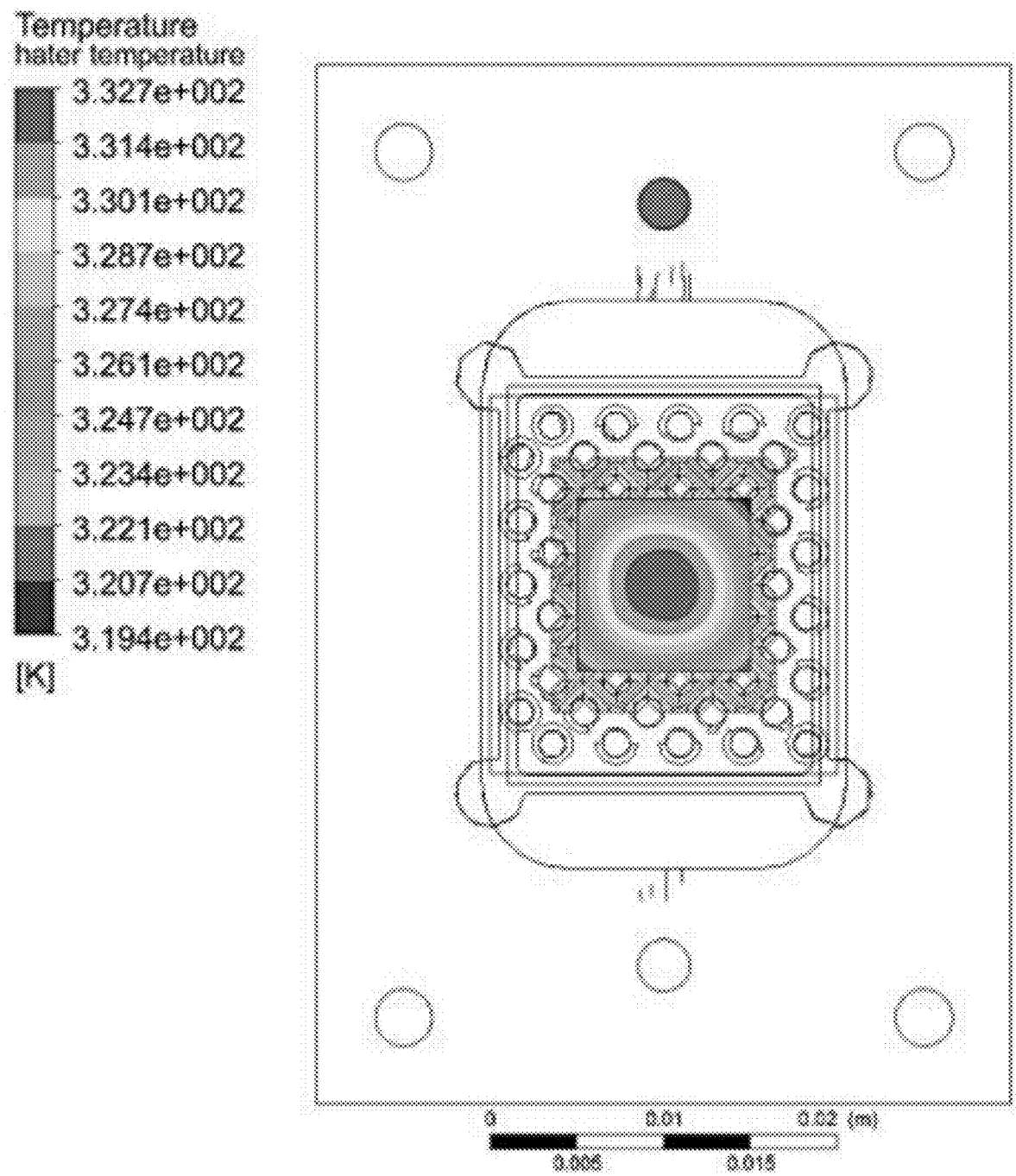
FIG. 13 is a diagram showing an analytical result of experimental examples according to embodiments of the present disclosure when applying laser bonding.
Figure 14:
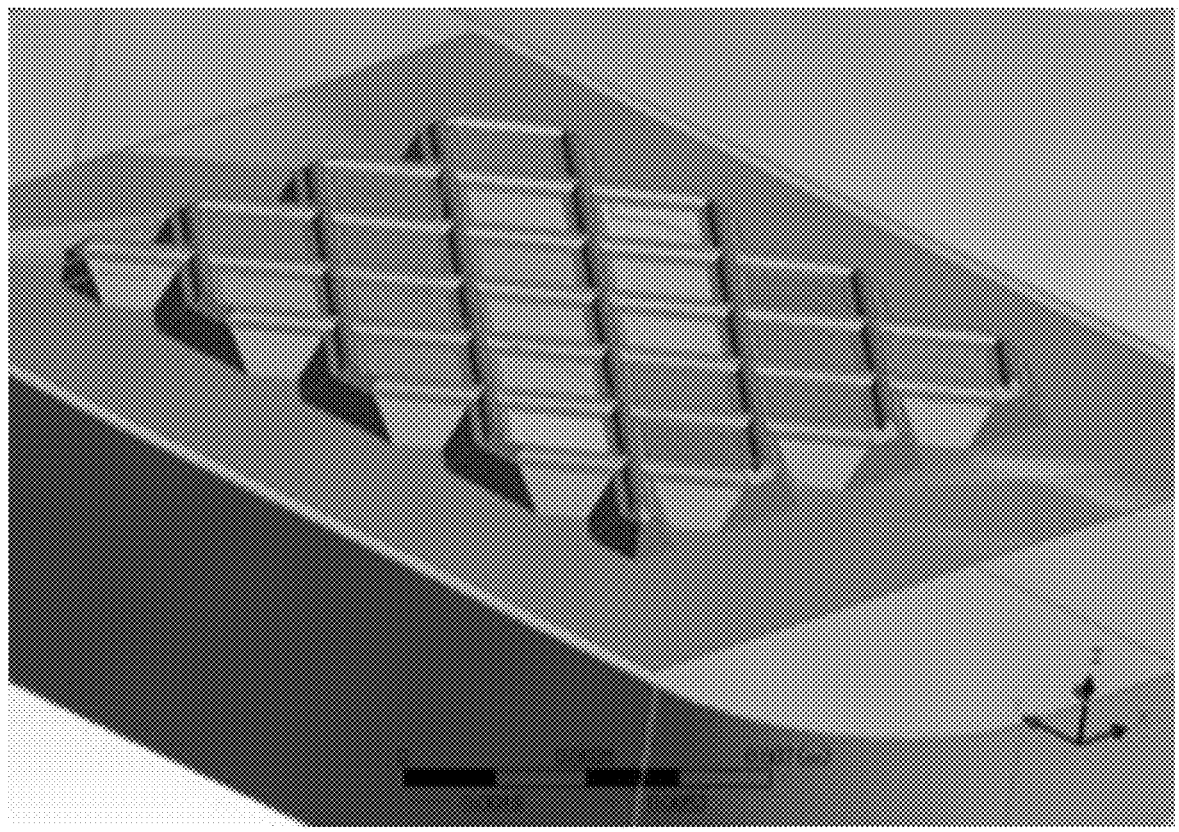
FIG. 14 is a diagram showing an attached surface area to pin-fin part of an experimental example according to embodiments of the present disclosure.

The thermal resistance when using solder bonding is twice as small as the thermal resistance when using grease (0.157[K/W] at 3.7 [L/min]). Furthermore, it is also found that the laser bonding is able to improve heat radiation performance almost the same as solder bonding. This result can be also obtained from simulation. The analytical result of laser bonding is shown in FIG. 13 and Table 5, respectively. Also, the attached surface area to pin-fin part is shown in FIG. 14. It can be seen from FIG. 14 that all of surface areas are not attached to pin-fin part. Only laser irradiated area is attached, and can transport heat generated from IC chip. It is assumed that the area which is not irradiated laser is adiabatic.

TABLE 5

| Bonding procedure | Average temperature of IC chip [° C.] |
|---|---|
| Solder bonding | 54.27 |
| Laser bonding | 54.62 |

Although the embodiments of the present disclosure have been described above with reference to the accompanying drawings, those skilled in the art will appreciate that the present disclosure can be implemented in various other embodiments without changing the technical ideas or features thereof.

What is claimed is:

1. A power module comprising:
a substrate;
a power conversion chip disposed on one surface of the substrate; and
a radiation member bonded to another surface of the substrate,
wherein the radiation member has a contact surface configured to come into contact with the other surface of the substrate, and includes a fused area within the contact surface so as to be fused to the other surface of the substrate, and
wherein the fused area has a mesh pattern.

2. The power module according to claim 1, wherein:
the substrate includes a dielectric layer and first and second metal layers respectively formed on opposite surfaces of the dielectric layer,
the power conversion chip is disposed on one surface of the first metal layer, and
the radiation member is bonded to one surface of the second metal layer.

3. The power module according to claim 1, wherein:
the radiation member includes a base plate forming the contact surface, and
radiation fins are formed on a surface of the base plate opposite the contact surface in a predetermined pattern.

4. The power module according to claim 3, wherein the fused area is formed in an area of the contact surface in which no radiation fin is formed.

* * * * *